United States Patent
Litsyn et al.

(10) Patent No.: US 10,115,584 B2
(45) Date of Patent: Oct. 30, 2018

(54) COMPOSITION AND METHOD FOR FORMING A DIELECTRIC LAYER

(71) Applicants: Ramot at Tel-Aviv University Ltd., Tel-Aviv (IL); Tower Semiconductor Ltd., Migdal HaEmek (IL)

(72) Inventors: Simon Litsyn, Tel-Aviv (IL); Gil Rosenman, Rishon-LeZion (IL); Amir Handelman, Hod-HaSharon (IL); Yakov Roizin, Afula (IL)

(73) Assignees: Ramot at Tel-Aviv University Ltd., Tel-Aviv (IL); Tower Semiconductor Ltd., Migdal HaEmek (IL)

( * ) Notice: Subject to any disclaimer, the term of this patent is extended or adjusted under 35 U.S.C. 154(b) by 0 days.

(21) Appl. No.: 15/690,392

(22) Filed: Aug. 30, 2017

(65) Prior Publication Data

US 2018/0005820 A1    Jan. 4, 2018

Related U.S. Application Data

(62) Division of application No. 14/398,735, filed as application No. PCT/IL2013/050395 on May 7, 2013.

(60) Provisional application No. 61/643,832, filed on May 7, 2012.

(51) Int. Cl.
| | |
|---|---|
| *B32B 3/10* | (2006.01) |
| *H01L 21/02* | (2006.01) |
| *C08J 9/26* | (2006.01) |
| *B82Y 30/00* | (2011.01) |
| *B82Y 40/00* | (2011.01) |

(52) U.S. Cl.
CPC ......... *H01L 21/02203* (2013.01); *C08J 9/26* (2013.01); *H01L 21/02164* (2013.01); *H01L 21/02211* (2013.01); *H01L 21/02255* (2013.01); *H01L 21/02282* (2013.01); *B82Y 30/00* (2013.01); *B82Y 40/00* (2013.01); *C08J 2201/042* (2013.01); *C08J 2205/024* (2013.01); *C08J 2383/04* (2013.01)

(58) Field of Classification Search
None
See application file for complete search history.

(56) References Cited

U.S. PATENT DOCUMENTS

| | | | |
|---|---|---|---|
| 5,895,263 | A | 4/1999 | Carter et al. |
| 6,264,741 | B1 | 7/2001 | Brinker et al. |
| 7,265,062 | B2 | 9/2007 | Mandal et al. |
| 7,740,933 | B2 | 6/2010 | Kim et al. |
| 8,334,127 | B2 | 12/2012 | Wang et al. |
| 2015/0108618 | A1 | 4/2015 | Litsyn et al. |

FOREIGN PATENT DOCUMENTS

WO    WO 2013/168159    11/2013

OTHER PUBLICATIONS

International Preliminary Report on Patentability dated Nov. 20, 2014 From the International Bureau of WIPO Re. Application No. PCT/IL2013/050395.

(Continued)

*Primary Examiner* — Christopher M Polley

(57) ABSTRACT

A porous layer is described. The porous layer comprises a solidified sol-gel inorganic material having a distribution of nanometric voids, wherein at least some of nanometric voids are at least partially coated internally by carbon or a hydrophobic substance containing carbon.

18 Claims, 3 Drawing Sheets

(56) References Cited

OTHER PUBLICATIONS

International Search Report and the Written Opinion dated Jul. 4, 2013 From the International Searching Authority Re. Application No. PCT/IL2013/050395.
Official Action dated Jun. 1, 2017 From the US Patent and Trademark Office Re. U.S. Appl. No. 14/398,735. (15 Pages).
Gohara et al. "Vimentin Intermediate Filaments as a Template for Silica Nanotube Preparation", The Journal of Biochemistry, 146(5): 627-631, Nov. 2009.
Gohara et al. "Vimentin Intermediate Filaments as a Template for Silica Nanotube Preparation", The Journal of Biochemistry, 146(5): 627-631, Nov. 2009. Abstract.
Ji et al. "Regulation of Silica Nanotube Diameters: Sol-Gel Transcription Using Solvent-Sensitive Morphological Change of Peptidic Lipid Nanotubes as Templates," Chemistry of Materials 19 (6): 1329-1334, 2007.
Loy "Sol-Gel Processing of Hybrid Organic-Inorganic Materials Based on Polysilsesquioxanes," in Hybrid Materials: Synthesis, Characterization, and Applications edited by Kickelbick, Chapter 6, 225-254, 2007.

COMPOSITION AND METHOD FOR FORMING A DIELECTRIC LAYER

RELATED APPLICATIONS

This application is a division of U.S. application Ser. No. 14/398,735 filed on Nov. 4, 2014, which is a National Phase of PCT Patent Application No. PCT/IL2013/050395 having International Filing Date of May 7, 2013, which claims the benefit of priority of U.S. Provisional Patent Application No. 61/643,832 filed May 7, 2012.

The contents of the above applications are all incorporated by reference as if fully set forth herein in their entirety.

FIELD AND BACKGROUND OF THE INVENTION

The present invention, in some embodiments thereof, relates to a sol-gel process and, more particularly, but not exclusively, to a composition suitable for use in a sol-gel process, e.g., for the fabrication of a layer having a reduced dielectric constant.

In the constant advancement of integrated circuit (IC) technology, it is desired to scale down of IC dimensions, so as to increase speed and density of the chip device. The speed of an electrical signal in an IC relies on the switching time of an individual transistor (transistor gate delay) and the signal propagation time between transistors (Resistance-Capacitance delay, known as the RC delay). As transistor features continue to diminish in size and density continues to increase, the RC delay that was once known to have least impact has now started playing a prominent role in chip performance. RC delay can be reduced by using high conductivity metals in interconnect wiring to lower the resistance (for example, Cu metallization instead of Al metallization), and/or by using materials having a low dielectric constant k in the inter-level dielectric layers to reduce the capacitance. Aside from reducing RC delay, low-k dielectric materials enable consumption of less power and reduce capacitive coupling, also known as crosstalk, between interconnect features.

Different approaches were developed and implemented in industry to decrease the dielectric constant of the interlayer dielectrics and different materials were used for this purpose. The first low-k dielectrics that were applied in industry were fluorinated silica glasses (FSG). FSG are typically not porous. They have a dense structure similar to silicon dioxide layers. SiO2 layers employed as isolating dielectric in IC have tetrahedral basic structure, where each Si atom is bonded to four oxygen atoms, and each oxygen atom to two silicon atoms. The high frequency dielectric constant at practical IC frequencies (up to THz) is about 4 and is associated with the polarizability of the Si—O bonds. To lower this value, the Si—O bonds have been proposed to be partially substituted with less polarizable Si—F bonds. Another option is to dope the silica glass with carbon, by introducing CH3 groups instead of O atoms. Both fluorine and carbon also increase the inter-atomic distances in silica, so that the density therefore also the dielectric constant is decreased. Such materials have characteristic dielectric constants of from about 3.2 to about 3.6.

Another class of low-k dielectrics are hydrogen and methyl silsesquioxanes (HSQ and MHQ) having a structure in which Hydrogen or CH3 radicals are connected to silicon atoms forming cage structures. Silsesquioxanes are organic-inorganic polymers with the presence of cage structures in the form of voids surrounded by eight silicon atoms. SiH and Si—CH3 have lower dielectric constant than Si—O since their polarizability is lower and since their micro-hollows make their volume density relatively small. The dielectric constants of HSQ and MSQ are typically 3.2 and 2.8, respectively.

Another known technique for reduction the value of the dielectric constant k is the use of porous dielectric layers. These layers are provided with pores having sizes which are typically larger than those allowed by the aforementioned cage structure. The typical pores in a porous dielectric layers are from several tens to several hundreds of angstroms. Since the dielectric constant of air is 1, the dielectric constant of a layer decreases with its porosity.

U.S. Pat. No. 5,895,263 discloses a process for forming a dielectric material for IC. The dielectric material is a porous organic polysilica having pore sizes less than 1000 angstroms. The obtained film has a dielectric constant less than 2.8.

U.S. Pat. No. 7,265,062, for example, discloses a process for forming porous silicon oxide-based films using a sol-gel approach utilizing a precursor solution formulation, including a purified non-ionic surfactant and an additive. The additive includes tetraalkylammonium salts and amines. The obtained film has a dielectric constant less than 2.5.

SUMMARY OF THE INVENTION

According to an aspect of some embodiments of the present invention there is provided a porous layer. The porous layer comprises a solidified sol-gel inorganic material having a distribution of nanometric voids, wherein at least some of nanometric voids are at least partially coated internally by carbon or a hydrophobic substance containing carbon.

According to an aspect of some embodiments of the present invention there is provided an integrated circuit, comprising at least one dielectric layer, wherein the dielectric layer is the porous layer as delineated above and optionally and preferably as further detailed hereinbelow.

According to some embodiments of the invention at least 70% of the voids are closed.

According to some embodiments of the invention at least 70% of the voids are isolated from other voids.

According to some embodiments of the invention at least 80% of the nanometric voids are generally spherical.

According to some embodiments of the invention an average size of the nanometric voids, along a largest dimension thereof, is less than 10 nm. According to some embodiments of the invention an average size of the nanometric voids, along a largest dimension thereof, is less than 5 nm. According to some embodiments of the invention an average size of the nanometric voids, along a largest dimension thereof, is from about 2 nm to about 5 nm.

According to some embodiments of the invention a variance in a size of the nanometric voids, along a largest dimension thereof, is less than 2 nm$^2$.

According to some embodiments of the invention the porous layer characterized by a dielectric constant which is less than 2.5.

According to an aspect of some embodiments of the present invention there is provided a composition. The comprising comprises a sol-gel precursor and a mixture of discrete nanoparticles of biological material in a medium that at least partially prevents assembly of the nanoparticles into supramolecular or colloidal structures.

According to an aspect of some embodiments of the present invention there is provided a method of forming a porous layer. The method comprises coating a substrate with the composition, drying the composition, and treating the dried composition so as to decompose the nanoparticles, thereby forming voids in the dried composition.

According to some embodiments of the invention the treating comprises applying a thermal treatment.

According to some embodiments of the invention the thermal treatment comprises calcination.

According to some embodiments of the invention the treating comprises applying optical radiation.

According to some embodiments of the invention the optical radiation is ultraviolet radiation.

According to some embodiments of the invention the method comprises passivating internal walls of the voids such that the walls are hydrophobic.

According to some embodiments of the invention the method comprises preparing the composition.

According to some embodiments of the invention the preparing comprises mixing the mixture with a solution containing the sol-gel precursor. According to some embodiments of the invention the solution comprises at least one component selected for at least partially preventing the assembly.

According to some embodiments of the invention the at least one component comprises a polar organic solvent.

According to some embodiments of the invention at least 70% of the discrete nanoparticles are generally spherical.

According to some embodiments of the invention a largest dimension of at least 70% of the discrete nanoparticles is less than 500 nm. According to some embodiments of the invention a largest dimension of at least 70% of the discrete nanoparticles is less than 100 nm. According to some embodiments of the invention a largest dimension of at least 70% of the discrete nanoparticles is less than 5 nm.

According to some embodiments of the invention the discrete nanoparticles comprise peptide nanoparticles.

According to some embodiments of the invention the discrete nanoparticles comprise protein nanoparticles.

According to some embodiments of the invention the discrete nanoparticles comprise viruses.

According to some embodiments of the invention the discrete nanoparticles comprise ferritin.

According to some embodiments of the invention a concentration of the discrete nanoparticles in the composition is from about 50% to about 95% by volume.

According to some embodiments of the invention the sol-gel precursor is an orthosilicate sol-gel precursor.

According to some embodiments of the invention the silicate sol-gel precursor comprises tetraethylorthosilicate.

According to some embodiments of the invention the sol-gel precursor comprises a silsesquioxane.

According to some embodiments of the invention the silsesquioxane is selected from the group consisting of a hydrogen silsesquioxane, a methyl silsesquioxane, and a silsesquioxane copolymer.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings.

With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a flowchart diagram of a method suitable for forming a porous layer, according to some embodiments of the present invention;

FIG. 2 is a schematic illustration of an integrated circuit, according to some embodiments of the present invention;

FIG. 3 is a schematic illustration an integrated circuit in an embodiment of the invention in which the integrated circuit is an image sensor; and FIG. 4 is another flowchart diagram further illustrating a method suitable for forming a porous layer, according to some embodiments of the present invention.

DESCRIPTION OF SPECIFIC EMBODIMENTS OF THE INVENTION

Figure 1:
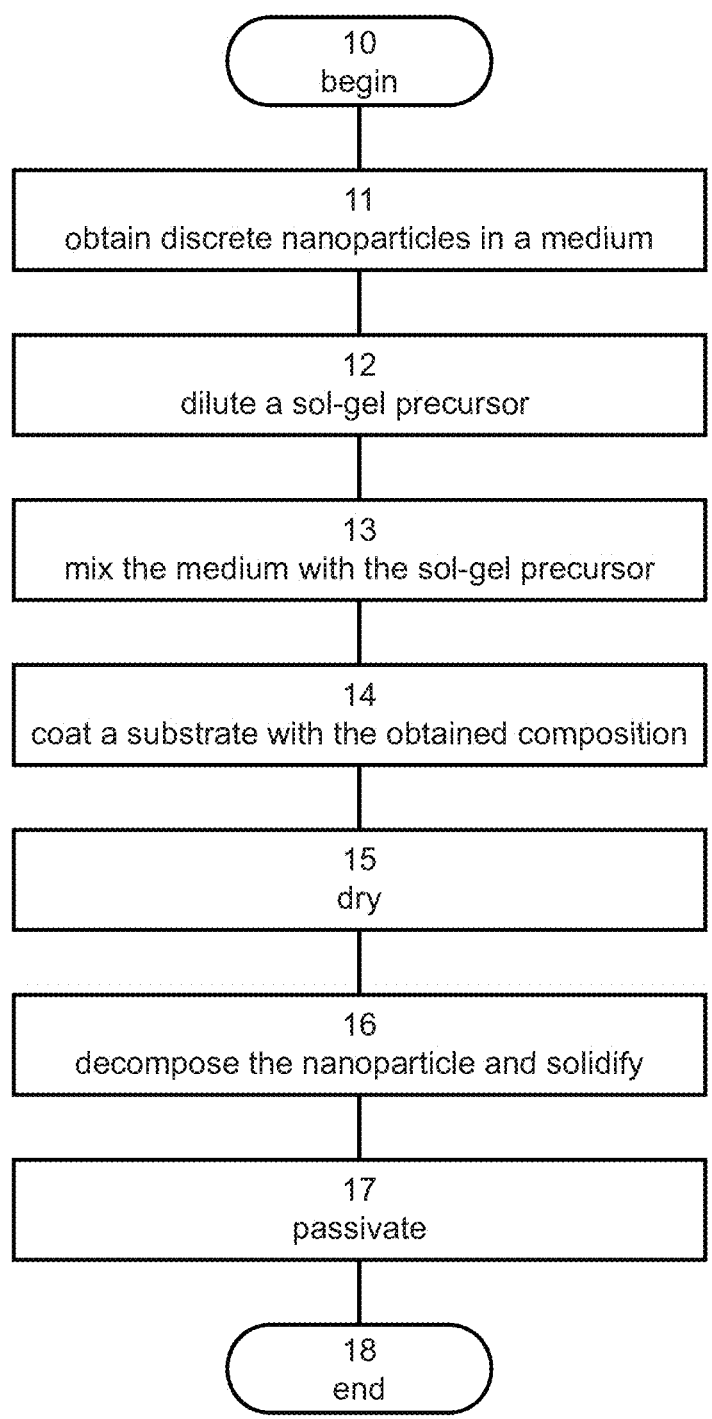

The present invention, in some embodiments thereof, relates to a sol-gel process and, more particularly, but not exclusively, to a composition suitable for use in a sol-gel process, e.g., for the fabrication of a layer having a reduced dielectric constant.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Some embodiments of the present invention provide a composition, having a sol-gel precursor and discrete organic nanoparticles. The composition is optionally and preferably in liquid form.

As used herein and in the art, the phrase "sol-gel precursor" describes a polymerizable compound that, when in solution, can undergo a sol-to-gel transformation to thereby produce a solidified sol-gel material.

The phrase "solidified sol-gel material" describes the product obtained upon polymerizing a sol-gel precursor in solution, optionally upon removal of the solvent.

In a sol-gel process molecules of the sol-gel precursor are dissolved in a suitable solvent and are thereafter subjected to conditions that effect sol-to-gel transformation. Such conditions are typically mild conditions (e.g., around room temperature, slightly acidic/basic pH, etc.). The sol-to-gel transformation typically involves polymerization of the sol-gel precursor, whereby the polymerization typically involves hydrolysis and condensation reactions. At the end of the sol-to-gel transformation, a biphasic material is obtained. This material is composed of a solid network of a polymer obtained by polymerization of the sol-gel precursor, in which the solvent is entrapped. Removal of the solvent results in a solidified sol-gel material. Removal of the solvent can be effected by any method known in the art, including solvent evaporation (at ambient pressure, or under reduced pressure, in the presence or absence of surface active agents) and critical point drying (CPD).

The sol-gel precursor can be, for example, a metal alkoxide monomer, a semi-metal alkoxide monomer, a metal ester monomer, a semi-metal ester monomer, a silazane monomer, a monomer having the formula M(R)n(P)m, whereas M is a metal or a semi metal, R is a hydrolyzable substituent, n is an integer from 2 to 6, P is a non-polymerizable substituent and m is and integer from 0 to 6, a partially hydrolyzed polymer thereof, a partially condensed polymer thereof and a combination thereof.

The metal M can be, for example, Si, Ti, Zr, Ni, Al and Zn. Preferably, the sol-gel precursor includes inorganic silica monomers such as, for example, tetraalkoxysilanes (e.g., tetramethoxysilane, tetraethoxysilane, etc.) or organically-modified silica monomers having the formula M(R)n(P)m described hereinabove, where M is Si.

An inorganic sol-gel material is obtained from sol-gel precursors as described herein, in which the monomer has the formula M(R)n(P)m, in which m=0 and n is determined by the valence of M, and include, for example, a metal alkoxide monomer, a semi-metal alkoxide monomer, a metal ester monomer, a semi-metal ester monomer, a silazane monomer.

A solidified inorganic sol-gel material is typically obtained upon polymerization of the sol-gel precursor and thereafter removal of the solvent as described herein. In some embodiments of the present invention the sol-gel precursor comprises tetraethylorthosilicate (corresponding to tetraethoxysilane wherein m=0 and R=ethoxy), and in some embodiments of the present invention the sol-gel precursor comprises a silsesquioxane (such as, but not limited to, hydrogen silsesquioxane, methyl silsesquioxane, silsesquioxane copolymer).

As used herein "nanoparticle" refers to a particle having a largest dimension less than 1 µm, preferably less than 500 nm, more preferably less than 100 nm, more preferably less than 50 nm, more preferably less than 10 nm, more preferably less than 5 nm, e.g., from about 2 nm to about 5 nm or from about 2 nm to about 4 nm or from about 2 nm to about 3 nm.

In some embodiments of the present invention the largest dimension of X % of the nanoparticles is less than 500 nm, more preferably less than 100 nm, more preferably less than 50 nm, more preferably less than 10 nm, more preferably less than 5 nm, e.g., from about 2 nm to about 5 nm, or from about 2 nm to about 4 nm, or from about 2 nm to about 3 nm, where X is at least 70 or at least 80 or at least 90 or at least 95 or at least 99.

As used herein, "organic nanoparticle" refers to a nanoparticle made at least in part of organic substance. As used herein, the phrase "organic substance" describes any substance that comprises carbon and hydrogen atoms, with or without additional elements.

The nanoparticles can have any shape. In various exemplary embodiments of the invention the nanoparticles are generally spherical.

As used herein "generally spherical" refers to a shape characterized by a sphericity of at least 0.7, more preferably at least 0.8 more preferably at least 0.9, e.g., 0.95 or 1.

The sphericity of an object is defined as the ratio between the surface area of a sphere having the same volume as the object and the surface area of the object.

For nanometric objects, it is oftentimes more convenient to estimate the average sphericity of a plurality of objects using a two-dimensional image (typically an electron microscope image) of the objects, wherein the orientations of the objects vary statistically thereamongst. From the two-dimensional image, the dimensions of each object across two directions parallel to the image plane (e.g., the largest dimension and smallest dimensions, or the largest dimension and the dimension along a direction orthogonal to the largest dimension, or the smallest dimension and the dimension along a direction orthogonal to the largest dimension) can be measured. An aspect ratio can then be calculated for each object as the ratio between the smaller measured dimension and the larger measured dimension, and the sphericity can be estimated as this ratio.

In various exemplary embodiments of the invention at least 70% or at least 80% or at least 90% or at least 95% or at least 99% of the nanoparticles are generally spherical.

In various exemplary embodiments of the invention X % of the nanoparticles are characterized by an aspect ratio of at least 0.7, more preferably at least 0.8 more preferably at least 0.9, e.g., 0.95 or 1, where X is at least 70 at least 80 or at least 90 or at least 95 or at least 99.

In some embodiments of the present invention the organic material comprises a biological material, more preferably chemically-synthesized biological material.

The terms "biological material" are used interchangeably herein to refer to any organic material, including a single organic molecule, that is, was, or can be a part of a living organism, regardless of whether the molecule is naturally occurring, recombinantly produced, or chemically synthesized in whole or in part.

It was found by the present inventors that the use of biomolecules is advantageous over existing compositions which lead to large dispersion of pore sizes.

Classes of biomolecules suitable for the present embodiments include, without limitation nucleic acids (and artificial analogs thereof), peptides, lipids, polysaccharides, monosaccharides, amino acids, nucleotides (as well as nucleosides, purines and pyrimidines), flavonoids, isoprenoids, oligomeric species, polymeric species and viruses.

Also contemplated, are oligonucleotides, genes, hormones, growth factors, enzymes, co-factors, antisenses, antibodies, antigens, vitamins, immunoglobulins, cytokines, prostaglandins, toxins, ferritins and the like. In some embodiments of the present invention the nanoparticles comprise at least one of peptides, nucleic acids, nucleotides and amino acids. Of the above substances, substances whose molecular shape is generally spherical are useful when it is desired to have generally spherical nanoparticles.

The term "peptide" as used herein encompasses native peptides (either degradation products, synthetically synthesized peptides or recombinant peptides) and peptidomimetics (typically, synthetically synthesized peptides), as well as peptoids and semipeptoids which are peptide analogs, which may have, for example, modifications rendering the peptides more stable while in a body. Such modifications include, but are not limited to N terminus modification, C terminus modification, peptide bond modification, including, but not limited to, $CH_2$—NH, $CH_2$—S, $CH_2$—S=O, O=C—NH, $CH_2$—O, $CH_2$—$CH_2$, S=C—NH, CH=CH or CF=CH, backbone modifications, and residue modification. Methods for preparing peptidomimetic compounds are well known in the art and are specified, for example, in Quantitative Drug Design, C. A. Ramsden Gd., Chapter 17.2, F. Choplin Pergamon Press (1992), which is incorporated by reference as if fully set forth herein. Further details in this respect are provided hereinunder.

Peptide bonds (—CO—NH—) within the peptide may be substituted, for example, by N-methylated bonds (—N($CH_3$)—CO—), ester bonds (—C(R)H—C—O—O—C (R)—N—), ketomethylen bonds (—CO—CH$_2$—), α-aza bonds (—NH—N(R)—CO—), wherein R is any alkyl, e.g., methyl, carba bonds (—CH$_2$—NH—), hydroxyethylene bonds (—CH(OH)—CH$_2$—), thioamide bonds (—CS—NH—), olefinic double bonds (—CH═CH—), retro amide bonds (—NH—CO—), peptide derivatives (—N(R)—CH$_2$—CO—), wherein R is the "normal" side chain, naturally presented on the carbon atom.

These modifications can occur at any of the bonds along the peptide chain and even at several (2-3) at the same time.

As used herein the phrase "amino acid" or "amino acids" is understood to include the 20 naturally occurring amino acids; those amino acids often modified post-translationally in vivo, including, for example, hydroxyproline, phosphoserine and phosphothreonine; and other unusual amino acids including, but not limited to, 2-aminoadipic acid, hydroxylysine, isodesmosine, nor-valine, nor-leucine and ornithine. Furthermore, the term "amino acid" includes both D- and L-amino acids.

Natural aromatic amino acids, Trp, Tyr and Phe, may be substituted for synthetic non-natural acid such as Phenylglycine, TIC, napthylalanine (Nal), phenylisoserine, threoninol, ring-methylated derivatives of Phe, halogenated derivatives of Phe or O-methyl-Tyr and β-amino acids.

The peptides of the present embodiments may include one or more modified amino acids or one or more non-amino acid monomers (e.g. fatty acids, complex carbohydrates etc).

The peptides can include aromatic and/or non-aromatic amino acid residue.

The phrase "aromatic amino acid residue", as used herein, describes an amino acid residue that has an aromatic moiety, as defined herein, in its side-chain.

In some embodiments each of the peptides comprises the amino acid sequence X-Y or Y-X, wherein X is an aromatic amino acid residue and Y is any other amino acid residue. Use of peptides which are devoid of aromatic amino acid residues is also contemplated.

The peptides of the present invention can be a single amino acid or a peptide composed of at least 2 amino acids in length.

In some embodiments of the present invention, one or several of the peptides is a polyaromatic peptide, which comprises one, two or more aromatic amino acid residues.

As used herein the phrase "polyaromatic peptides" refers to peptides which include at least 80%, more preferably at least 85%, more preferably at least 90%, more preferably at least 95% or more aromatic amino acid residues. In some embodiments, at least one peptide consists essentially of aromatic amino acid residues. In some embodiments, each peptide consists essentially of aromatic amino acid residues.

Thus for example, the peptides can include any combination of: dipeptides composed of one or two aromatic amino acid residues; tripeptides including one, two or three aromatic amino acid residues; and tetrapeptides including two, three or four aromatic amino acid residues and so on.

In some embodiments of the present invention, the aromatic amino acid are any naturally occurring or synthetic aromatic residue including, but not limited to, phenylalanine, tyrosine, tryptophan, phenylglycine, or modificants, precursors or functional aromatic portions thereof.

In some embodiments, one or more peptides include two amino acid residues, and hence is a dipeptide.

Each of these dipeptides can include one or two aromatic amino acid residues.

Preferably, but not obligatorily each of these dipeptides includes two aromatic amino acid residues. The aromatic residues composing the dipeptide can be the same, such that the dipeptide is a homodipeptide, or different. In some embodiments, the nanostructures are formed from homodipeptides.

Hence, in some embodiments each peptide is a homodipeptide composed of two aromatic amino acid residues that are identical with respect to their side-chains residue.

The aromatic amino acid residues can comprise an aromatic moiety, where the phrase "aromatic moiety" describes a monocyclic or polycyclic moiety having a completely conjugated pi-electron system. The aromatic moiety can be an all-carbon moiety or can include one or more heteroatoms such as, for example, nitrogen, sulfur or oxygen. The aromatic moiety can be substituted or unsubstituted, whereby when substituted, the substituent can be, for example, one or more of alkyl, trihaloalkyl, alkenyl, alkynyl, cycloalkyl, aryl, heteroaryl, heteroalicyclic, halo, nitro, azo, hydroxy, alkoxy, thiohydroxy, thioalkoxy, cyano and amine.

Exemplary aromatic moieties include, for example, phenyl, biphenyl, naphthalenyl, phenanthrenyl, anthracenyl, [1,10]phenanthrolinyl, indoles, thiophenes, thiazoles and, [2,2']bipyridinyl, each being optionally substituted. Thus, representative examples of aromatic moieties that can serve as the side chain within the aromatic amino acid residues described herein include, without limitation, substituted or unsubstituted naphthalenyl, substituted or unsubstituted phenanthrenyl, substituted or unsubstituted anthracenyl, substituted or unsubstituted [1,10]phenanthrolinyl, substituted or unsubstituted [2,2']bipyridinyl, substituted or unsubstituted biphenyl and substituted or unsubstituted phenyl.

The aromatic moiety can alternatively be substituted or unsubstituted heteroaryl such as, for example, indole, thiophene, imidazole, oxazole, thiazole, pyrazole, pyridine, pyrimidine, quinoline, isoquinoline, quinazoline, quinoxaline, and purine. When substituted, the phenyl, naphthalenyl or any other aromatic moiety includes one or more substituents such as, but not limited to, alkyl, trihaloalkyl, alkenyl, alkynyl, cycloalkyl, aryl, heteroaryl, heteroalicyclic, halo, nitro, azo, hydroxy, alkoxy, thiohydroxy, thioalkoxy, cyano, and amine.

Representative examples of homodipeptides that can be used to form the nanostructures of the present embodiments include, without limitation, a naphthylalanine-naphthylalanine dipeptide, phenanthrenylalanine-phenanthrenylalanine dipeptide, anthracenylalanine-anthracenylalanine dipeptide, [1,10]phenanthrolinylalanine-[1,10]phenanthrolinylalanine dipeptide, [2,2']bipyridinylalanine-[2,2']bipyridinylalanine dipeptide, (pentahalo-phenylalanine)-(pentahalo-phenylalanine) dipeptide, phenylalanine-phenylalanine dipeptide, (amino-phenylalanine)-(amino-phenylalanine) dipeptide, (dialkylamino-phenylalanine)-(dialkylamino-phenylalanine) dipeptide, (halophenylalanine)-(halophenylalanine) dipeptide, (alkoxy-phenylalanine)-(alkoxy-phenylalanine) dipeptide, (trihalomethyl-phenylalanine)-(trihalomethyl-phenylalanine) dipeptide, (4-phenyl-phenylalanine)-(4-phenyl-phenylalanine) dipeptide and (nitro-phenylalanine)-(nitro-phenylalanine) dipeptide.

In some embodiments of the present invention one or more of the peptides is modified by end-capping.

The phrase "end-capping modified peptide", as used herein, refers to a peptide which has been modified at the N-(amine)terminus and/or at the C-(carboxyl)terminus thereof. The end-capping modification refers to the attachment of a chemical moiety to the terminus, so as to form a cap. Such a chemical moiety is referred to herein as an end-capping moiety and is typically also referred to herein and in the art, interchangeably, as a peptide protecting moiety or group.

The phrase "end-capping moiety", as used herein, refers to a moiety that when attached to the terminus of the peptide, modifies the end-capping. The end-capping modification typically results in masking the charge of the peptide terminus, and/or altering chemical features thereof, such as, hydrophobicity, hydrophilicity, reactivity, solubility and the like. Examples of moieties suitable for peptide end-capping modification can be found, for example, in Green et al., "Protective Groups in Organic Chemistry", (Wiley, second ed. 1991) and Harrison et al., "Compendium of Synthetic Organic Methods", Vols. 1-8 (John Wiley and Sons, 1971-1996).

The use of end-capping modification, allows to control the chemical properties and charge of the nanostructures. End-capping of a peptide can be used to modify its hydrophobic/hydrophilic nature.

Representative examples of N-terminus end-capping moieties suitable for the present embodiments include, but are not limited to, formyl, acetyl (also denoted herein as "Ac"), trifluoroacetyl, benzyl, benzyloxycarbonyl (also denoted herein as "Cbz"), tert-butoxycarbonyl (also denoted herein as "Boc"), trimethylsilyl (also denoted "TMS"), 2-trimethylsilyl-ethanesulfonyl (also denoted "SES"), trityl and substituted trityl groups, allyloxycarbonyl, 9-fluorenylmethyloxycarbonyl (also denoted herein as "Fmoc"), and nitroveratryloxycarbonyl ("NVOC").

Representative examples of C-terminus end-capping moieties suitable for the present embodiments are typically moieties that lead to acylation of the carboxy group at the C-terminus and include, but are not limited to, benzyl and trityl ethers as well as alkyl ethers, tetrahydropyranyl ethers, trialkylsilyl ethers, allyl ethers, monomethoxytrityl and dimethoxytrityl. Alternatively the —COOH group of the C-terminus end-capping may be modified to an amide group.

Other end-capping modifications of peptides include replacement of the amine and/or carboxyl with a different moiety, such as hydroxyl, thiol, halide, alkyl, aryl, alkoxy, aryloxy and the like, as these terms are defined herein.

In some embodiments of the present invention, all of the peptides that are used for coating are end-capping modified.

End-capping moieties can be further classified by their aromaticity. Thus, end-capping moieties can be aromatic or non-aromatic.

Representative examples of non-aromatic end capping moieties suitable for N-terminus modification include, without limitation, formyl, acetyl trifluoroacetyl, tert-butoxycarbonyl, trimethylsilyl, and 2-trimethylsilyl-ethanesulfonyl. Representative examples of non-aromatic end capping moieties suitable for C-terminus modification include, without limitation, amides, allyloxycarbonyl, trialkylsilyl ethers and allyl ethers.

Representative examples of aromatic end capping moieties suitable for N-terminus modification include, without limitation, fluorenylmethyloxycarbonyl (Fmoc). Representative examples of aromatic end capping moieties suitable for C-terminus modification include, without limitation, benzyl, benzyloxycarbonyl (Cbz), trityl and substituted trityl groups.

When dipeptides are employed, they can be collectively represented by the following general Formula I:

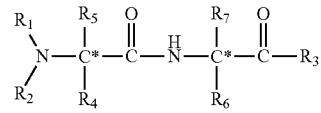

Formula I where:

C* is a chiral or non-chiral carbon; $R_1$ and $R_2$ are each independently selected from the group consisting of hydrogen, alkyl, cycloalkyl, aryl, carboxy, thiocarboxy, C-carboxylate and C-thiocarboxylate; $R_3$ is selected from the group consisting of hydroxy, alkoxy, aryloxy, thiohydroxy, thioalkoxy, thioaryloxy, halo and amine; and each of $R_4$-$R_7$ is independently selected from the group consisting of hydrogen, alkyl, cycloalkyl, aryl, heteroaryl, heteroalicyclic, hydroxy, thiohydroxy (thiol), alkoxy, aryloxy, thioalkoxy, thioaryloxy, C-carboxylate, C-thiocarboxylate, N-carbamate, N-thiocarbamate, hydrazine, guanyl, and guanidine, as these terms are defined herein, provided that at least one of $R_4$-$R_7$ comprises an aromatic moiety, as defined hereinabove.

Also contemplated are embodiments in which one or more of $R_4$-$R_7$ is other substituent, provided that at least one comprises an aromatic moiety.

Also contemplated are embodiments in which one or more of $R_1$-$R_3$ is the end-capping moieties described hereinabove.

Depending on the substituents, each of the C* carbon atoms in each of the compounds described above, can be chiral or non-chiral. Any chiral carbon atom that is present in the peptides of the present embodiments can be in D-configuration, L-configuration or racemic. Thus, the present embodiments encompass any combination of chiral and racemic carbon atoms, including all the possible stereoisomers, optical isomers, enantiomers, and anomers. The peptides of the present embodiments can be synthesized while retaining a configuration of the reactants (e.g., the amino acids). Hence, by selecting the configuration of the reactants (e.g., amino acids) and the appropriate syntheses conditions, the optical purity (e.g., the inclusion of chiral and/or racemic carbons) and the obtained stereoisomers of the resulting peptides can be determined. In cases where racemic mixtures are obtained, known techniques can be used to separate the optical or stereo-isomers. Such techniques are described, for example, in "Organic chemistry, fourth Edition by Paula Yurkanis Bruice, page 180-185 and page 214, Prentice Hall, Upper Sadde River, N.J. 07458."

In various exemplary embodiments of the invention the nanoparticles are formed from no more than two molecules of the biological material. For example, the nanoparticles can be dipeptides, e.g., NH2-Phe-Phe-COOH dipeptides and/or NH3-Phe-Trp-COOH dipeptides.

It is to be understood, however that the use of nanoparticles made of more than two molecules is not excluded from the scope of the present invention. For example, the nanoparticles can be tripeptides, e.g., Boc triphenylalanine or the like.

The discrete organic nanoparticles of the present embodiments are preferably present in the sol-gel precursor under conditions that at least partially prevent assembly of the nanoparticles into supramolecular or colloidal structures.

As used herein "supramolecular structure" refers to any structure composed of sub-units connected via non-covalent interaction.

The term supramolecular structure encompasses at least any of the following structures: nanotube, nanowire, nanosphere, nanorod, nanodisk, nanotape and hydrogel.

Thus, the nanoparticles according to some exemplary embodiments of the invention are "elementary building blocks" of supramolecular structures each being composed of a plurality of nanoparticles bound to each other by non-covalent bonds (e.g., weak bonds such as H-bonds and bonds maintained by Van der Waals forces).

The nanoparticles are "elementary" in the sense that that they cannot be disassembled into their constituents, unless their covalent bonds are broken by supplying energy which at least equals their covalent bond energies. Although being elementary building blocks, the nanoparticles of the present embodiments preferably remain discrete, since they are not assembled into supramolecular or colloidal structures.

Nanoparticles which are not assembled into a supramolecular or colloidal structure are referred to herein as "discrete nanoparticle". In various exemplary embodiments of the invention at least 70%, or at least 80% or at least 90% or at least 95%, preferably 99% or more of the nanoparticles in the composition are in the form of discrete nanoparticles.

Discrete nanoparticles can be provided in more than one way.

In some embodiments, the discrete nanoparticles are provided as non-assembled particles. In these embodiments the raw material used for the preparation of composition includes non-assembled nanoparticles.

In some embodiments of the present invention, a top-down process is employed for providing the discrete nanoparticles. In these embodiments the addition of nanoparticles to the sol-gel precursor is preceded by the top-down process to provide the discrete nanoparticles. The top down process can be a chemical process. For example, supramolecular or colloidal structures can be treated in inorganic solution (e.g., sulfuric acids of sufficiently low pH useful for disassembling, for example, peptide supramolecular structures), or organic solution (e.g., hexafluoro-2-propanol useful for disassembling, for example, peptide supramolecular structures). The top-down process can also be a mechanical process, e.g., treatment by ultrasound waves or the like. Also contemplated is optical disassembling wherein supramolecular or colloidal structures are irradiated with an optical field, such as UV light or the like.

In some embodiments of the present invention, the discrete nanoparticles are formed by a bottom-up process. For example, a peptide material including peptide oligomers can be provided and conditions can be generated for to allow the oligomers to form discrete peptide nanoparticles. The formation of peptide nanoparticles from oligomers optionally and preferably precedes the addition of the particles to the sol-gel precursor.

Also contemplated are embodiments in which amino acid molecules are provided as nanoparticles. In these embodiments, the amino acids first form peptide oligomers by dimerization, trimerization, tetramization and/or multimerization. This is optionally and preferably accomplished using an appropriate multimerization agent, such as, but not limited to, one or more fusion molecules. Thereafter, the peptide oligomers form the nanoparticles as further detailed hereinabove. The nanoparticles can then be added to the sol-gel precursor solution. Alternatively, the amino acid molecules can be added to the sol-gel precursor, in which case the amino acid molecules either enact the nanoparticles or they can form oligomers in-situ while being in the sol-gel precursor solution.

In various exemplary embodiments of the invention the nanoparticles are introduced into a medium that prevents them from being assembled into supramolecular or colloidal structures. A representative example of such medium is a polar organic solvent, and preferably a protic polar organic solvent. Examples include, but are not limited to, an alcohol having the formula ROH, where R represents an alkyl group, in particular a linear or branched alkyl group having 1-20 carbon atoms, more preferably a lower alkyl group having 1-4 carbon atoms, e.g., methanol, ethanol, propanol, isopropanol and butanol; and an acid of the formula $RC(=O)OH$, where R represents hydrogen, an alkyl group, in particular a linear or branched alkyl group having 1-20 carbon atoms, more preferably a lower alkyl group having 1-4 carbon atoms, e.g., acetic acid, ethanoic acid, propanoic acid, etc. The medium is preferably also used for diluting the sol-gel precursor prior to the addition of the particles thereto.

The concentration of the nanoparticles in the composition of the present embodiments is preferably from about 50% to about 95% or from about 60% to about 95% from about 70% to about 95% from about 80% to about 95% from about 90% to about 95% by volume.

The present inventors found that the composition of the present embodiments is advantageous over conventional composition, particularly when it is desired to fabricate porous dielectric layers for integrated circuits, using the nanoparticles of the present embodiments as porogen particles.

As used herein, the term "porous" describes a solid structure having a distribution of discontinuities in the material from which the structure is made, wherein the size of the discontinuities is larger than the characteristic largest lattice constant of the structure.

As used herein, the term "porous layer" refers to a layer, such as, but not limited to, a layer of an integrated circuit, which is in the form of a porous structure. Typically, a porous layer is deposited on a substrate, such as, but not limited to, a base substrate of an integrated circuit, or on another layer, such as, but not limited to, a patterned layer forming an active circuit in an integrated circuit.

In conventional techniques, an increase in the partial volume occupied by the porogen particles is accompanied by a substantial increment in the number of interconnected pores and pore clusters. This is due to the interaction between the conventional porogen particles and the sol-gel material.

The present inventors unexpectedly discovered that the composition of the present embodiments allows for formation of a layer having voids which are optionally isolated and/or closed, even when the total volume of the voids is several tens of percentage of the total volume of the layer. The present inventors found that sol-gel precursors that are suitable for dielectric layers of integrated circuit are chemically compatible with the nanoparticles of the present embodiments, in the sense that they are generally inert at the stage of cross-linking.

As used herein the term "void" refers to a discontinuity in the material from which the porous layer is made, which discontinuity has a size which is larger than the largest lattice constant of the layer.

Thus the composition of the present embodiments is advantageous both from the standpoint of chemical compatibility between the nanoparticles and the sol-gel precursor, and from the standpoint of maintaining the nanoparticles in their discrete form.

Reference is now made to FIG. 1 which is a flowchart diagram of a method suitable for forming a porous layer, according to some embodiments of the present invention. The method is particularly useful for forming a layer having a reduced dielectric constant.

The term "reduced dielectric constant" refers to a dielectric constant (relative to the dielectric constant of the vacuum) lower than the dielectric constant of $SiO_2$ (relative to the dielectric constant of the vacuum), when measured at the same conditions, particularly the same temperature and the same frequency.

A structure having a reduced dielectric constant is abbreviated herein as a "low-k structure."

It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The method begins at 10 and optionally and preferably proceeds to 11 at which a mixture of discrete organic nanoparticles in a medium is provided. The nanoparticles can be received already in their discrete form, or they can be prepared by the method, using either a top-down or bottom-up technique as further detailed hereinabove. The method can receive a previously prepared mixture. Alternatively, the method can mix the nanoparticles in the medium. In various exemplary embodiments of the invention the medium that at least partially prevents assembly of the nanoparticles into supramolecular or colloidal structures, as further detailed hereinabove.

At 12 the method optionally and preferably dilutes a sol-gel precursor with a component that that at least partially prevents assembly of the nanoparticles into supramolecular or colloidal structures, as further detailed hereinabove. Preferably, the dilution is performed before, optionally less than 30 minutes before, the sol-gel precursor is combined with the nanoparticles.

In various exemplary embodiments of the invention both the medium containing the mixture of the nanoparticles and the sol-gel precursor contain the same component that at least partially prevents assembly. In various exemplary embodiments of the invention the method proceeds to 13 at which the mixture of nanoparticles is mixed with the sol-gel precursor to provide a composition useful for a sol-gel process.

Alternatively, operations 11-13 can be skipped and the method can receive a previously prepared composition in liquid form useful for a sol-gel process, wherein the composition comprises at least a sol-gel precursor and a mixture of discrete organic nanoparticles in a medium, as further detailed hereinabove.

The method continues to 14 in which a substrate is coated with the prepared or received composition.

The substrate can be a base substrate or a package substrate of an integrated circuit, or it can be a patterned layer of an integrated circuit wherein the pattern forms an active circuit area in the integrated circuit.

In various exemplary embodiments of the invention the coating is by spinning, as known in the art. For example, the composition can be dispensed on the substrate, e.g., at the center thereof, and the substrate can be placed on a spinner. Subsequently, the substrate is rotated to effect centrifugal forces that ensure a substantially uniform distribution of the liquid composition on the surface of the substrate. Typically, but not necessarily the spinning process is executed at room temperature (e.g., about 25° C.) and atmospheric pressure (e.g., about 101 kPa).

The method optionally and preferably continues to 15 at which the composition is dried. This can be achieved, for example, by heating the coated substrate to a temperature above the boiling point of the solvent and for a time-period which is sufficient to remove at least 95%, more preferably at least 99%, more preferably substantially all the solvent. Typical temperatures for operation 15 are from about 100° C. to about 300° C., and a typical time period is from about 30 minutes to about 120 minutes. Other temperatures and time-periods are not excluded from the scope of the present invention.

The drying operation effects a sol-gel process. The components of the sol-gel precursor undergo hydrolysis and condensation reactions. The molecular weight of the oxide species that are produced in the liquid composition ("sol") during the condensation continuously increases in course of heating, and links are formed thereamongst to form a three-dimensional network ("gel").

The method of the present embodiments continues to 16 at which the dried composition, which is typically in a gel state, is treated to decompose the nanoparticles.

In some embodiments of the present invention the decomposing includes a thermal treatment which both decomposes the nanoparticles and solidifies the gel. The employed temperature depends on the material from which the nanoparticles are formed. For example, the coated substrate can be subjected to a calcination process. Suitable temperatures for decomposing the nanoparticles and solidify the gel are typically from about 300° C. to about 600° C. Other temperatures are not excluded from the scope of the present invention. A typical time-period for the thermal treatment is, without limitation, from about 30 minutes to about 120 minutes.

In some embodiment, the decomposing includes applying optical radiation, such as, but not limited to, ultraviolet radiation which is known to decompose certain types of organic materials, particularly peptides, proteins and the like. In these embodiments, a further thermal treatment is applied to solidify the gel, optionally and preferably subsequently to the radiation.

Once the nanoparticles are decomposed and the gel is solidified, the locations within the gel that were occupied by the nanoparticles become vacant and a solid layer having a distribution of voids is formed. It was found by the present inventors that the use of the nanoparticles of the present embodiments allows formation of isolated and closed voids in the layer. In various exemplary embodiments of the invention at least 70% or at least 80% or at least 90% of the voids are closed, and at least 70% or at least 80% or at least 90% of the voids are isolated from other voids.

Residual carbon molecules from the decomposed organic nanoparticles optionally sediment on the internal of the voids. This is advantageous since the carbon makes the walls of the voids more hydrophobic.

In some embodiments of the present invention, the method proceeds to 17 at which the internal walls of said voids are passivated, to make the walls even more hydrophobic. For example, a hydrophobic primer such as, but not limited to, a hexamethyl disilazane (HDMS) or octadecyltrichlorosilane or phenyltriethoxysilane can be applied to the solidified layer, so as to form a thin hydrophobic layer (e.g., a monolayer) on the internal walls of the voids. For example, an HDMS gas can be applied in a vacuum oven.

The method ends at 18.

According to some embodiment of the present invention there is provided a method of forming a composition suitable to be used as modified precursor in a sol-gel process. The method optionally and preferably comprises executing operations 11, 12 and 13 of FIG. 1, as further detailed hereinabove.

According to some embodiment of the present invention there is provided a porous layer, which comprises a solidified sol-gel inorganic material having a distribution of nanometric voids, wherein at least some of the nanometric voids are at least partially coated internally by carbon molecules or a hydrophobic substance containing carbon. The porous layer can be fabricated, for example, by a sol-gel process employing the composition of the present embodiments. In a representative embodiment, selected operations of the method illustrated in FIG. 1 are executed for forming the porous layer.

As used herein, "nanometric void" refers to a void whose largest dimension i.e. less than 1 micron.

In various exemplary embodiments of the invention the average size of the voids, along a largest dimension thereof, is less than 500 nm, more preferably less than 100 nm, more preferably less than 50 nm, more preferably less than 10 nm, more preferably less than 5 nm, e.g., from about 2 nm to about 5 nm or from about 2 nm to about 4 nm or from about 2 nm to about 3 nm.

The average size of the voids can be estimated from an image of the porous layer (typically an electron microscope image). The number of voids in the image can be counted and the size of each void along its largest dimension in the plane of the image can be measured. The average size of the voids can then be estimated as the ratio between the sum of measured sizes and the number of voids.

In various exemplary embodiments of the invention at least 70% or at least 80% or at least 90% or at least 95% or at least 99% of the voids are generally spherical.

In various exemplary embodiments of the invention X % of the voids are characterized by an aspect ratio of at least 0.7, more preferably at least 0.8 more preferably at least 0.9, e.g., 0.95 or 1, where X is at least 70 or at least 80 or at least 90 or at least 90 or at least 99.

The porous layer of the present embodiments is optionally and preferably characterized by a dielectric constant which is less than 2.5 or less than 2.4 or less than 2.3 or less than 2.2 or less than 2.1 or less than 2.0. In some embodiments of the present invention the variance in the size of the voids over the layer is less than 2 $nm^2$ or less than 1 $nm^2$.

Figure 2:
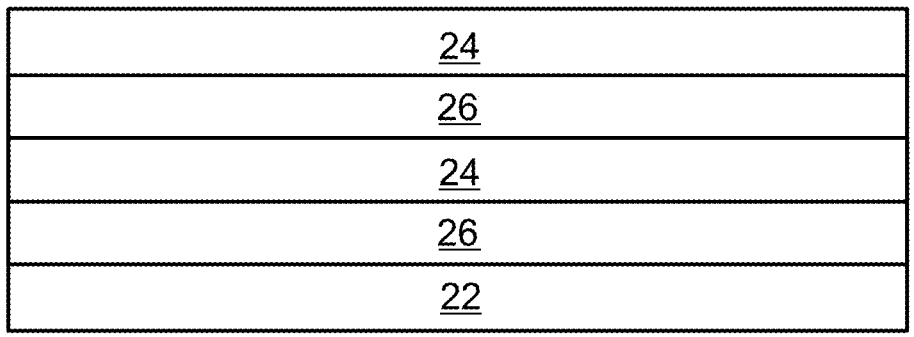

Reference is now made to FIG. 2 which is a schematic illustration of an integrated circuit 20, according to some embodiments of the present invention. Integrated circuit 20, comprises a base substrate 22 and one or more patterned layers 24 each of which function as an active circuit as known in the art of integrated circuits. Base substrate 22 and patterned layer(s) 24 are separated from each other by one or more dielectric layers 26. At least one of the dielectric layers 26 is a porous layer which comprises a solidified sol-gel inorganic material having a distribution of nanometric voids, wherein at least some of the nanometric voids are at least partially coated internally by carbon molecules or a hydrophobic substance containing carbon, as further detailed hereinabove.

Integrated circuit 20 can be implemented in a variety of electronic devices, including, without limitation, image sensors, microprocessors, transmitters and receivers of electromagnetic radiations, non-volatile memories, controllers, implantable medical devices, and the like. It is expected that during the life of a patent maturing from this application many relevant electronic devices featuring integrated circuits will be developed and the scope of the term electronic device is intended to include all such new technologies a priori.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

Figure 3:
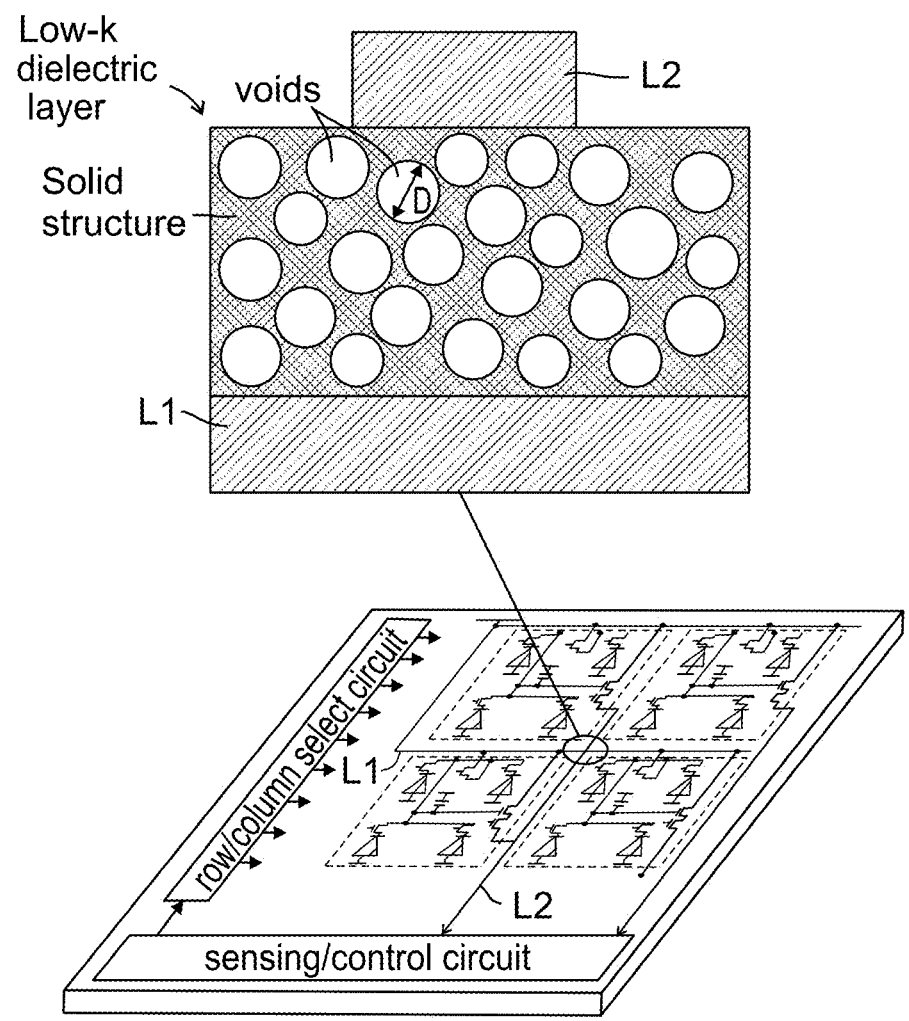

A low-k dielectric layer according to some embodiments of the present invention can be employed in an integrated circuit, such as, but not limited to, an image sensor, as illustrated in FIG. 3, in which the lower panel illustrates a perspective view and the upper panel illustrates a cross-sectional view of the integrated circuit.

The dielectric layer is typically utilized between conductive and/or semiconductive patterned layers of an integrated circuit device. The voids in the dielectric layer are preferable generally spherical with a diameter D from about 1 nm to about to 500 nm. The total volume of the voids makes up from about 50% to about 95% of the total volume of the dielectric layer.

Example 2

Figure 4:
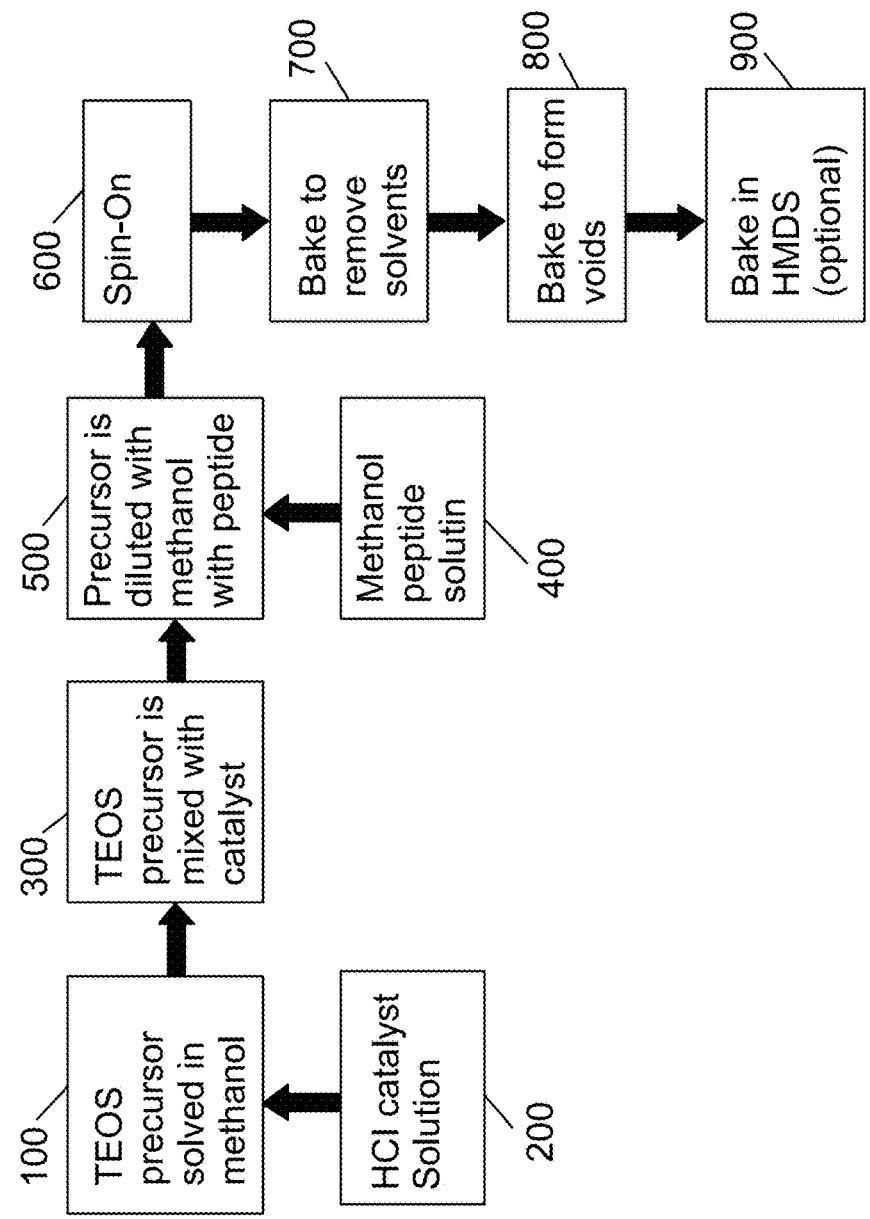

FIG. 4 is a schematic illustration of an exemplified method suitable for forming a porous layer, according to some embodiments of the present invention. The starting material is optionally and preferably high-purity grade tetraethylorthosilicate (TEOS). It is firstly hydrolyzed and then polymerized according to reactions:

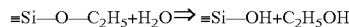

and

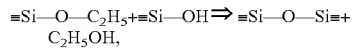

To perform hydrolyzation, about 20 ml of isopropanol can be added to about 10 ml of TEOS (FIG. 4, at 100). HCl can then be added to water to obtain about 5 mmol concentration solution and about 1 ml of the obtained HCl solution can be mixed with about 10 ml of isopropanol (FIG. 4, at 200). The obtained acid catalyst can then be added to accelerate the hydrolysis reactions of the silicate.

The two parts containing isopropanol are optionally and preferably mixed together, for example, by intensive stirring stage (FIG. 4, at 300). The temperature can be increased to about 82-83° C. (the boiling of isopropanol starts at 82° C.; otherwise TEOS is not mixed with water; HCl acts as a catalyst). The corresponding reaction is:

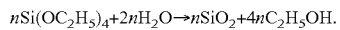

This forms a spin-on glass (SOG) which is a transparent "sol" of organic solvents (ethanol and isopropanol) containing Si—O network polymers.

The SOG is optionally and preferably cooled to room temperature, preferably in a closed vessel so as not to absorb water vapors from the air. Immediately before the spinning, the SOG is optionally and preferably diluted by methanol (FIG. 4, at 500), preferably by stirring, and preliminary mixed with a medium, e.g., methanol containing nanoparticles, such as, but not limited to, peptide nanoparticles (FIG. 4, at 400). In the medium, the volume of the particles can be about 10 ml, and the volume of the methanol can be about 20 ml.

The methanol solvent at least partially prevents assembly of the peptide nanoparticles into supramolecular or colloidal structures. At this stage, a composition comprising the sol-gel precursor TEOS and peptide nanospheres (typical size 2-3 nm) is obtained.

The composition can then be spin-coated on a substrate, e.g., an 8" silicon wafer (FIG. 4, at 600). A typical spinning speed is from about 3000 to about 10000 rev/min. Centrifugal draining during the spinning process allows to coat the surface generally uniformly. The typical thickness of the obtained film is from about 1 µm to about 2 µm.

The coated wafer can then be baked, e.g., at a temperature of about 200° C. for about 1 hour (FIG. 4, at 700). Typically, a hot plate can be used for the baking. The baking continues the hydrolysis and condensation of the precursor and removes the solvents from the fabricated film. After the bake, a polymerized layer having therein peptide nanospheres is obtained. The separated positions of the particles are fixed in space during the baking due to the very high viscosity of the obtained layer.

The obtained substrate can then be further baked to form a porous layer (FIG. 4, at 800). The temperature for operation 800 is selected to ensure that the peptide porogen is decomposed and the gaseous products of the reaction diffuse out from the porous film. A suitable temperature level is about 400° C.

An interconnected structure in the glass matrix provides continuous pathways for the organic residuals to escape during the low temperature baking 700. At the high temperature baking 800 part of the pathways are closed and it is more difficult for the decomposed peptide molecules to escape from the forming porous oxide matrix. At this stage, the film is comprised of a hard matrix of silicon dioxide with less interconnected system of pores. Some of the carbon that originated from the decomposition of peptide spheres, interacts with the walls of the silicon dioxide. This is advantageous since it eliminates part of the residual hydrogen containing complexes. The carbon related bonds have lower polarizibility than silicon bonds and thus contribute to the lowering of k. Another advantage is that this interaction reduces the extent of moisture absorption by the porous layer.

As an additional countermeasure against moisture absorption, a further treatment in HMDS vapors at temperatures of from about 100° C. to about 250° C. can be employed (FIG. 4 at 900). Such a treatment substitutes the polar Si—OH bonds by non-polar Si—CH3 bonds and thus further suppresses adsorption of water radicals.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of forming a porous layer, comprising:
    disassembling peptide supramolecular structures into discrete peptide nanospheres;
    coating a substrate with a composition comprising a sol-gel precursor and a mixture of said discrete nanospheres in a medium that at least partially prevents assembly of said nanosphreres into supramolecular or colloidal structures, wherein a variance in a size of said nanosphreres is less than 2 nm$^2$;
    drying said composition; and
    treating said dried composition so as to decompose said nanospheres, thereby forming voids in said dried composition.

2. The method according to claim 1, wherein said treatment comprises calcination.

3. The method of claim 2, wherein said calcination is at a temperature of from about 300° C. to about 600° C.

4. The method according to claim 1, wherein said treating comprises applying optical radiation.

5. The method according to claim 4, wherein said optical radiation is ultraviolet radiation.

6. The method according to claim 1, further comprising passivating internal walls of said voids such that said walls are hydrophobic.

7. The method according to claim 6, wherein said passivation is by a hydrophobic primer selected from the group consisting of a hexamethyldisilazane, a octadecyltrichlorosilane and a phenyltriethoxysilane.

8. The method according to claim 1, wherein said sol-gel precursor is an orthosilicate sol-gel precursor.

9. The method according to claim 1, wherein said silicate sol-gel precursor comprises tetraethylorthosilicate.

10. The method according to claim 1, wherein said sol-gel precursor comprises a silsesquioxane.

11. The method according to claim 10, wherein said silsesquioxane is selected from the group consisting of a hydrogen silsesquioxane, a methyl silsesquioxane, and a silsesquioxane copolymer.

12. The method according to claim 1, further comprising preparing said composition.

13. The method according to claim 12, wherein said preparing comprises mixing said mixture with a solution containing said sol-gel precursor.

14. The method according to claim 13, wherein said solution comprises at least one component selected for at least partially preventing said assembly.

15. The method according to claim 14, wherein said at least one component comprises a polar organic solvent.

16. The method according to claim 1, wherein at least 70% of said discrete nanospheres are of the same size.

17. The method according to claim 1, wherein a largest dimension of at least 70% of said discrete nanospheres is less than 50 nm.

18. The method according to claim 1, wherein a concentration of said discrete nanospheres in the composition is from about 50% to about 95% by volume.

* * * * *